United States Patent
Lin et al.

(10) Patent No.: US 11,075,336 B2
(45) Date of Patent: Jul. 27, 2021

(54) MAGNETIC RANDOM ACCESS MEMORY AND MANUFACTURING METHOD THEREOF

(71) Applicant: TAIWAN SEMICONDUCTOR MANUFACTURING CO., LTD., Hsinchu (TW)

(72) Inventors: Shy-Jay Lin, Hsinchu County (TW); Chwen Yu, Taipei (TW); William J. Gallagher, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/743,981

(22) Filed: Jan. 15, 2020

(65) Prior Publication Data

US 2020/0152865 A1     May 14, 2020

Related U.S. Application Data

(62) Division of application No. 15/940,286, filed on Mar. 29, 2018, now Pat. No. 10,541,361.
(Continued)

(51) Int. Cl.
*H01L 43/12* (2006.01)
*H01L 27/22* (2006.01)
(Continued)

(52) U.S. Cl.
CPC ............ *H01L 43/12* (2013.01); *G11C 11/161* (2013.01); *H01F 10/3254* (2013.01);
(Continued)

(58) Field of Classification Search
CPC ........ H01L 43/12; H01L 43/02; H01L 27/222
See application file for complete search history.

(56) References Cited

U.S. PATENT DOCUMENTS 7,226,831 B1 *  6/2007  Metz .................. H01L 29/0847
                                                      438/216
9,224,675 B1  12/2015  DeHaven et al.
(Continued)

FOREIGN PATENT DOCUMENTS

JP    H08-88229 A    4/1996
JP    2013-239728 A  11/2013

OTHER PUBLICATIONS

Chen, Xiaohong, et al. "Magnetic Tunnel Junction Based on MgO Barrier Prepared by Natural Oxidation and Direct Sputtering Deposition" Nano-Micro Lett. 4(1), pp. 25-29, 2012.
(Continued)

*Primary Examiner* — Herve-Louis Y Assouman
(74) *Attorney, Agent, or Firm* — McDermott Will & Emery LLP

(57) ABSTRACT

In a method of manufacturing a semiconductor device, a magnetic random access memory (MRAM) cell structure is formed. The MRAM cell structure includes a bottom electrode, a magnetic tunnel junction (MTJ) stack and a top electrode. A first insulating cover layer is formed over the MRAM cell structure. A second insulating cover layer is formed over the first insulating cover layer. An interlayer dielectric (ILD) layer is formed. A contact opening in the ILD layer is formed, thereby exposing the second insulating cover layer. A part of the second insulating cover layer and a part of the first insulating cover layer are removed, thereby exposing the top electrode. A conductive layer is formed in the opening contacting the top electrode. The second insulating cover layer has an oxygen getter property.

20 Claims, 17 Drawing Sheets

Related U.S. Application Data

(60) Provisional application No. 62/593,087, filed on Nov. 30, 2017.

(51) Int. Cl.
*H01L 43/08* (2006.01)
*H01L 43/02* (2006.01)
*H01F 10/32* (2006.01)
*H01F 41/34* (2006.01)
*G11C 11/16* (2006.01)

(52) U.S. Cl.
CPC ........... *H01F 41/34* (2013.01); *H01L 27/222* (2013.01); *H01L 27/228* (2013.01); *H01L 43/02* (2013.01); *H01L 43/08* (2013.01)

(56) References Cited

U.S. PATENT DOCUMENTS

| | | | |
|---|---|---|---|
| 9,647,200 B1 | 5/2017 | Annunziata et al. | |
| 2005/0263829 A1* | 12/2005 | Song | H01L 29/7843 257/379 |
| 2008/0316657 A1 | 12/2008 | Zhang et al. | |
| 2009/0085058 A1* | 4/2009 | Mather | B82Y 25/00 257/104 |
| 2009/0209050 A1* | 8/2009 | Wang | H01L 43/12 438/3 |
| 2012/0097616 A1 | 4/2012 | Backman et al. | |
| 2015/0137286 A1* | 5/2015 | Guo | H01L 43/12 257/421 |
| 2016/0268499 A1 | 9/2016 | You et al. | |

OTHER PUBLICATIONS http://www.steeldata.info/etch/demo/list/nitrides.html.

Kim, Woojin, et al. "Extended Scalability of Perpendicular STT-MRAM Towards Sub-20-nm MTJ Node," EE Times, May 7, 2012.

Office Action received in U.S. Appl. No. 15/940,286, dated Jul. 25, 2019.

* cited by examiner

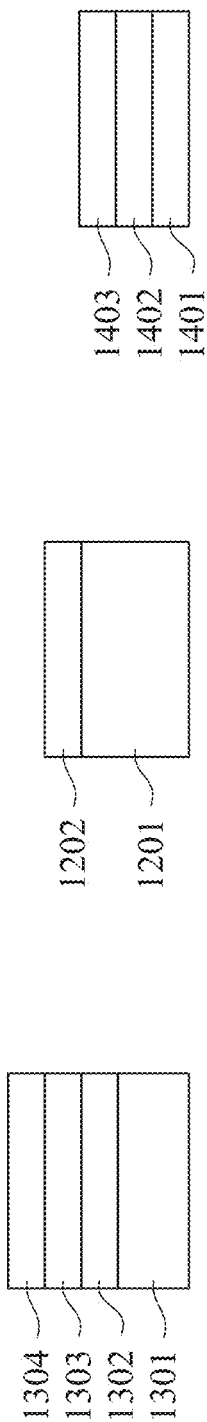

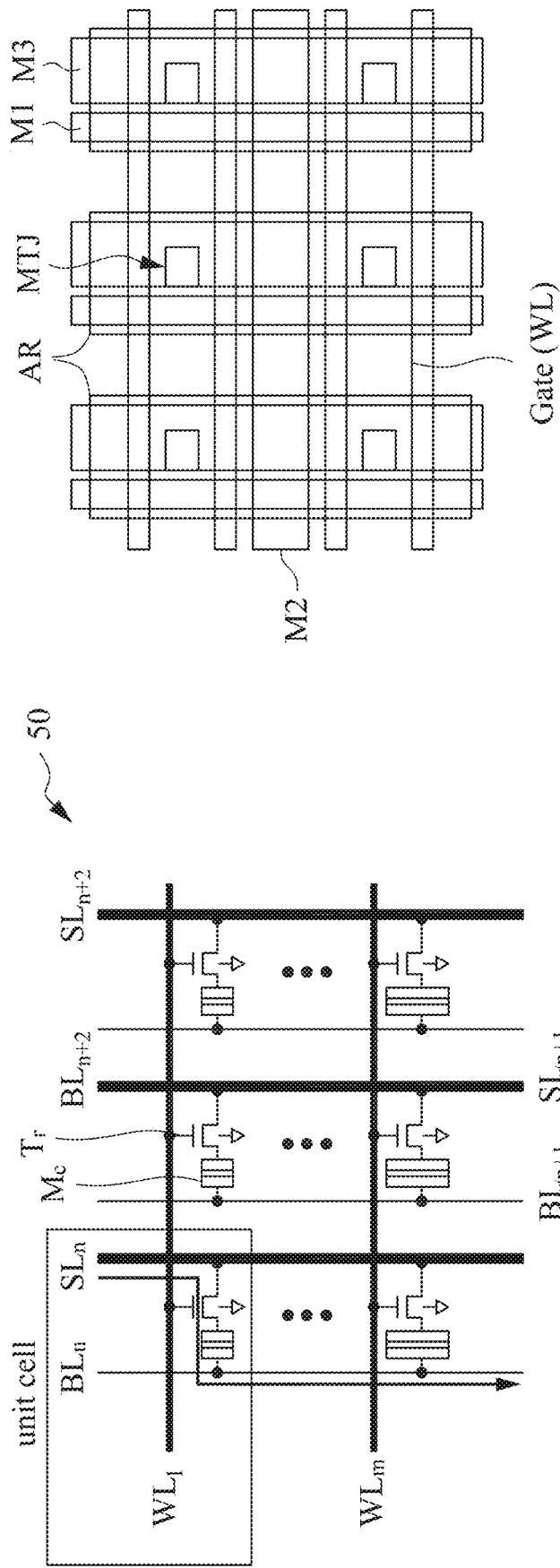
FIG. 4A
FIG. 4C
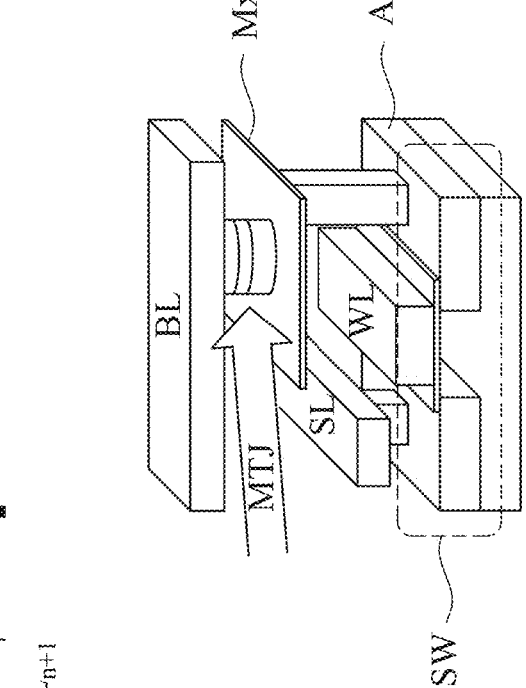
FIG. 4B

MAGNETIC RANDOM ACCESS MEMORY AND MANUFACTURING METHOD THEREOF

RELATED APPLICATION

This application is a Divisional application of U.S. patent application Ser. No. 15/940,286, filed Mar. 29, 2018, which claims priority to Provisional Patent Application No. 62/593,087 filed on Nov. 30, 2017, the entire contents of each of which are incorporated herein by reference.

TECHNICAL FIELD

The present disclosure relates to a magnetic random access memory (MRAM) device and, more particularly, to an MRAM device based on a magnetic tunnel junction cell formed with a semiconductor device.

BACKGROUND

An MRAM offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers which are separated by a thin insulating barrier, and operates by tunneling of electrons between the two ferromagnetic layers through the insulating barrier.

BRIEF DESCRIPTION OF THE DRAWINGS

FIGS. 2A, 2B and 2C show schematic cross sectional views of magnetic layers of the MTJ film stack according to an embodiment of the present disclosure.

FIG. 4A shows a schematic circuit diagram of an MTJ MRAM,
FIG. 4B shows a schematic perspective view of a memory cell of the MTJ MRAM and FIG. 4C shows a memory cell layout of the MTJ MRAM.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

Figure 1B:
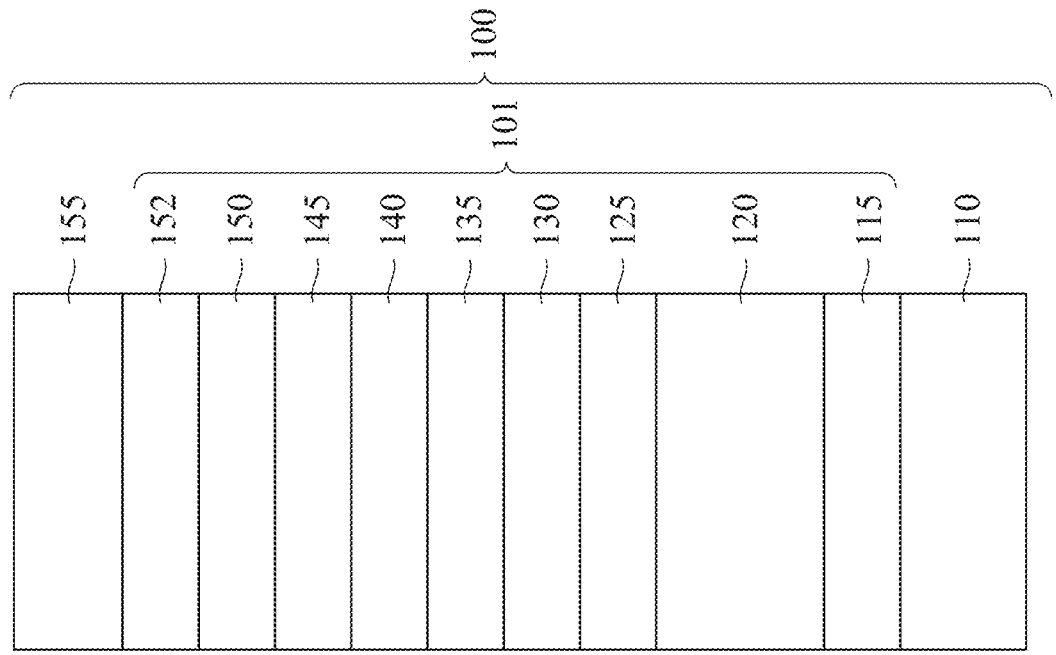
FIG. 1B is a schematic cross sectional view of the MTJ film stack according to an embodiment of the present disclosure.
Figure 1A:
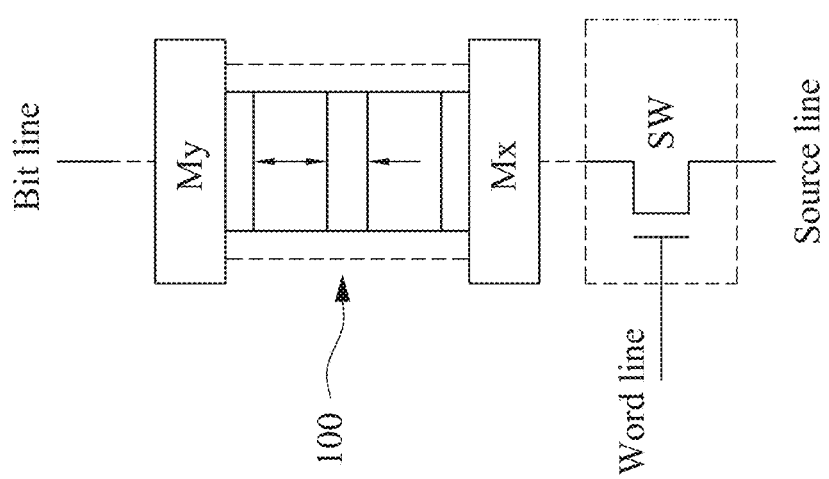
FIG. 1A is a schematic view of an MTJ MRAM cell according to an embodiment of the present disclosure.

FIG. 1A is a schematic view of a MTJ MRAM cell according to an embodiment of the present disclosure, and FIG. 1B is a schematic cross sectional view of the MTJ film stack. The MTJ film stack 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. The upper metal layer My is coupled to a bit line. In some embodiments, the switching device SW is disposed between the upper metal layer My and the bit line.

The MTJ film stack 100 shown in FIG. 1B includes a first electrode layer 110 coupled to the lower metal layer Mx and a second electrode layer 155 coupled to the upper metal layer My. An MTJ functional layer 101 is disposed between the first electrode layer 110 and the second electrode layer 155.

The MTJ functional layer 101 includes a second pinned magnetic layer 130, a free magnetic layer 140, and a tunneling barrier layer 135 made of a non-magnetic material and disposed between the second pinned magnetic layer 130 and the free magnetic layer 140. The free magnetic layer 140 and the second pinned magnetic layer 130 include one or more ferromagnetic materials that can be magnetically oriented, respectively. The second pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the second pinned layer 130 is in a range from about 0.8 nm to about 2.0 nm.

The tunneling barrier layer 135 includes a relatively thin oxide layer capable of electrically isolating the free magnetic layer 140 from the second pinned magnetic layer 130 at low potentials and capable of conducting current through electron tunneling at higher potentials. In some embodiments, the tunneling barrier layer 135 is made of magnesium oxide (MgO) having a thickness in a range from about 0.5 nm to about 1.2 nm.

The MTJ functional layer 101 further includes an antiferromagnetic layer 125, as shown in FIG. 1B. The antiferromagnetic layer 125 is used to fix the magnetic orientation of the second pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ functional layer 101 further includes a first pinned magnetic layer 120 and a second pinned magnetic layer 130 both including one or more magnetic materials, as shown in FIG. 1B.

The first electrode layer 110 is formed on the lower metal layer Mx made of, for example, Cu, Al, W, Co, Ni, and/or an alloy thereof, and the upper metal layer My made of, for example, Cu, Al, W, Co, Ni, and/or an alloy thereof, is formed on the second electrode layer 155.

The second pinned magnetic layer 130 includes multiple layers of magnetic materials. In some embodiments, as shown in FIG. 2A, the second pinned magnetic layer 130 includes four layers 1301, 1302, 1303 and 1304, where the layer 1304 is in contact with the tunneling barrier layer 135 and the layer 1301 is in contact with the antiferromagnetic layer 125. In some embodiments, the layer 1301 (the bottommost layer) includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1301 is in a range from about 2.0 nm to about 5.0 nm in some embodiments. The layer 1302 includes a cobalt layer having a thickness in a range from about 0.4 nm to about 0.6 nm. In certain embodiments, the layer 1301 is the cobalt layer and the layer 1302 is the multilayer of the cobalt layers and the platinum layers as set forth above. In this disclosure, an "element" layer generally means that the content of the "element" is more than 99%.

The layer 1303 is a spacer layer. The thickness of the spacer layer 1303 is in a range from about 0.2 nm to about 0.5 nm in some embodiments. The layer 1304 is a cobalt iron boron (CoFeB) layer, a cobalt/palladium (CoPd) layer and/or a cobalt iron (CoFe) layer. The thickness of the layer 1304 is in a range from about 0.8 nm to about 1.5 nm in some embodiments.

The first pinned magnetic layer 120 includes multiple layers of magnetic materials. In some embodiments, as shown in FIG. 2B, the first pinned magnetic layer 120 includes two layers 1201 and 1202, where the layer 1202 is in contact with the antiferromagnetic layer 125. In some embodiments, the layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1201 is in a range from about 5.0 nm to about 10.0 nm in some embodiments. The layer 1202 includes a cobalt layer having a thickness in a range from about 0.4 nm to about 0.6 nm.

The free magnetic layer 140 includes a cobalt iron boron (CoFeB) layer, a cobalt/palladium (CoPd) layer and/or a cobalt iron (CoFe) layer having a thickness in a range from about 1.0 nm to about 2.0 nm in some embodiments. In other embodiments, the free magnetic layer 140 includes multiple layers of magnetic materials. In some embodiments, as shown in FIG. 2C, the free magnetic layer 140 includes three layers 1401, 1402 and 1403, where the layer 1401 is in contact with the tunneling barrier layer 135. The layers 1401 and 1403 are a cobalt iron boron (CoFeB) layer, a cobalt/palladium (CoPd) layer and/or a cobalt iron (CoFe) layer having a thickness in a range from about 1.0 nm to about 2.0 nm in some embodiments. The layer 1402 is a spacer layer. The thickness of the spacer layer 1402 is in a range from about 0.2 nm to about 0.6 nm in some embodiments.

The MTJ functional layer 101 further includes a seed layer 115 formed on the first electrode layer 110, a capping layer 145 formed on the free magnetic layer 140, and a diffusion barrier layer 150 formed on the capping layer 145, as shown in FIG. 1B. The capping layer 145 is made of a dielectric material, such as magnesium oxide or aluminum oxide, and has a thickness in a range from about 0.5 nm to about 1.5 nm in some embodiments. The first electrode layer 110 is made of a conductive material, such as a metal (e.g., Ta, Mo, Co, Pt, Ni), to reduce the resistance of the first pinned magnetic layer 120, especially for programming. The second electrode layer 155 is also made of a conductive material, such as a metal, to reduce the resistivity during reading.

The pinned magnetic layer, the free magnetic layer and the antiferromagnetic layer can also be formed by physical vapor deposition (PVD), molecular beam epitaxy (MBE), pulsed laser deposition (PLD), atomic layer deposition (ALD), electron beam (e-beam) epitaxy, chemical vapor deposition (CVD), or derivative CVD processes further comprising low pressure CVD (LPCVD), ultrahigh vacuum CVD (UHVCVD), reduced pressure CVD (RPCVD), or any combinations thereof, or any other suitable film deposition method. The tunneling barrier layer and the diffusion barrier layer can also be formed by CVD, PVD or ALD or any other suitable film deposition method.

Figure 3B:
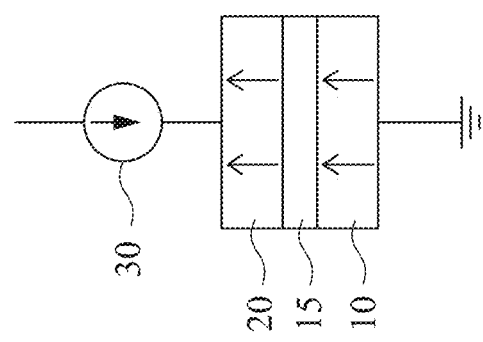
FIGS. 3A and 3B show operations of the MTJ film stack.
Figure 3D:
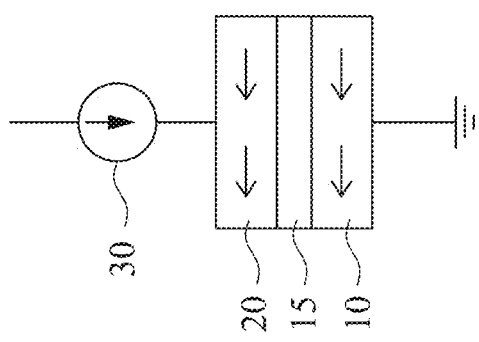
FIGS. 3C and 3D show operations of the MTJ film stack.
Figure 3A:
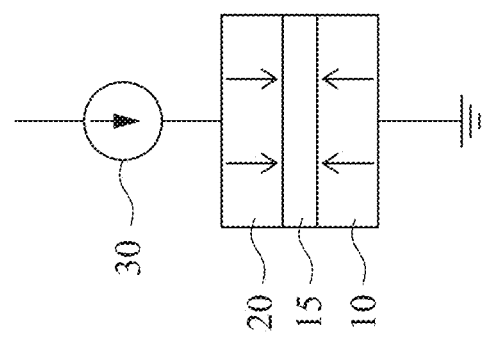

FIGS. 3A and 3B show a memory operation of an MTJ cell. As shown in FIGS. 3A and 3B, the MTJ cell includes a pinned magnetic layer 10, a tunneling barrier layer 15 and a free magnetic layer 20. The pinned magnetic layer 10 corresponds to the second pinned magnetic layer 130 or a combination of the first pinned magnetic layer 120, the antiferromagnetic layer 125 and the second pinned magnetic layer 130 of FIG. 1B. The tunneling barrier layer 15 corresponds to the tunneling barrier layer 135 of FIG. 1B and the free magnetic layer 20 corresponds to the free magnetic layer 140 of FIG. 1B. In FIGS. 3A and 3B, the remaining layers are omitted. In some embodiments, a current source 30 is connected in series.

Figure 3C:
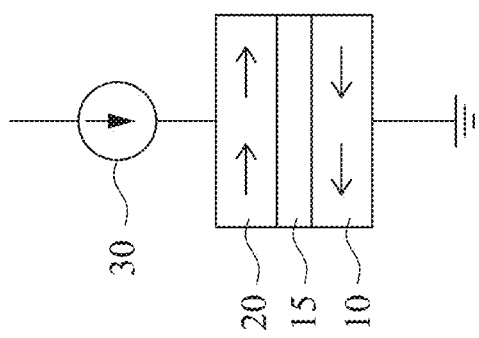

In FIG. 3A, the pinned magnetic layer 10 and the free magnetic layer 20 are magnetically oriented in opposite directions. In some embodiments, the spin directions of the pinned magnetic layer 10 and the free magnetic layer 20 are perpendicular to the film stack direction (parallel with the surface of the films). In FIG. 3B, the pinned magnetic layer 10 and the free magnetic layer 20 are magnetically oriented in the same direction. In other embodiments, the spin directions are horizontal (parallel to the surfaces of the MTJ layers) and the spin direction of the free layer 20 changes between left-to-right and right-to-left directions, as shown in FIGS. 3C and 3D.

If the same current value Ic is forced to flow through the MTJ cell, it is found that the cell voltage $V_1$ in the case of FIG. 3A is larger than the cell voltage $V_2$ in the case of FIG. 3B, because the resistance of an opposite-oriented MTJ cell shown in FIG. 3A (high-resistance state) is greater than the resistance of a same-oriented MTJ cell shown in FIG. 3B (low-resistance state). Binary logic data ("0" and "1") can be stored in a MTJ cell and retrieved based on the cell orientation and resulting resistance. Further, since the stored data does not require a storage energy source, the cell is non-volatile.

FIG. 4A shows a schematic circuit diagram of an MTJ MRAM array 50. Each memory cell includes a MTJ cell Mc and a transistor Tr, such as a MOS FET. The gate of the transistor Tr is coupled to one of word lines $WL_1 \ldots WL_m$ and a drain (or a source) of the transistor Tr is coupled to one end of the MTJ cell Mc, and another end of the MTJ cell is coupled to one of bit lines $BL_n$, $BL_{n+1}$ and $BL_{n+2}$. Further, in some embodiments, signal lines (not shown) for programming are provided adjacent to the MTJ cells.

A memory cell is read by asserting the word line of that cell, forcing a reading current through the bit line of that cell, and then measuring the voltage on that bit line. For example, to read the state of a target MTJ cell, the word line is asserted to turn ON the transistor Tr. The free magnetic layer of the target MTJ cell is thereby coupled to one of the fixed potential lines $SL_n$, $SL_{n+1}$ and $SL_{n+2}$, e.g., the ground, through the transistor Tr. Next, the reading current is forced on the bit line. Since only the given reading transistor Tr is turned ON, the reading current flows through the target MTJ cell to the ground. The voltage of the bit line is then measured to determine the state ("0" or "1") of the target MTJ cell. In some embodiments, as shown in FIG. 4A, each MTJ cell has one reading transistor Tr. Therefore, this type of MRAM architecture is called 1T1R. In other embodiments, two transistors are assigned to one MTJ cell, forming a 2T1R system. Other cell array configurations can be employed.

FIG. 4B shows a schematic perspective view of a memory cell of the MTJ MRAM and FIG. 4C shows a memory cell layout of the MTJ MRAM.

As shown in FIGS. 4B and 4C, the MTJ cell MTJ is disposed above a switching device SW, such as a MOS FET. The gate Gate of the MOSFET is a word line WL or coupled to a word line formed by a metal layer. The bottom electrode Mx of the MTJ cell is coupled to a drain of the MOS FET formed in an active region AR and a source of the MOS FET formed in the active region AR is coupled to the source line SL. The upper electrode of the MTJ cell is coupled to a bit line BL. In some embodiments, the source line SL can be formed by metal layers M1 and M2, and the bit line BL can be formed by a metal layer M3. In certain embodiments, one of more metal wirings are a single device layer, and in other embodiments, one or more metal wirings are two or more device layers.

Electrical and/or physical properties of the MTJ MRAM depend upon a size or a volume of the MTJ film stack. For example, read/write speed of the MTJ MRAM is affected by the size or the volume of the MTJ film stack. Generally, when the size or the volume of the MTJ is smaller, the read/write speed becomes faster. In contrast, when the size or the volume of the MTJ is larger, the MTJ film stack is more resistant against thermal processes (larger thermal budget) in the manufacturing process of the MRAM. In the present disclosure, one MRAM device includes multiple MTJ MRAM cells having different MTJ sizes or volumes.

The resistance or a ratio of high-resistance and low-resistance of the MTJ MRAM cell stack is affected by an oxidation amount of the MTJ film stack. When under oxidized, the ratio is low, and when over oxidized, the ratio is also low. Thus, it is important to control the oxidation amount of the MTJ film stack. In particular, it is necessary to prevent the MTJ film stack from being over-oxidized after the MTJ film stack is patterned.

Figure 5:
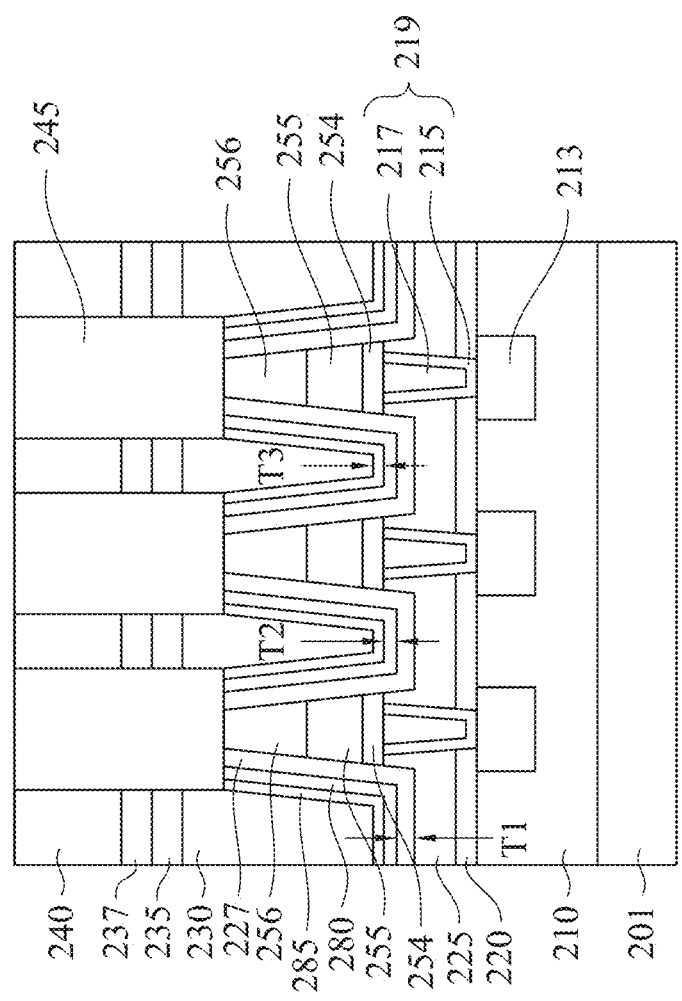
FIG. 5 shows a cross sectional view of a semiconductor device including an MRAM according to an embodiment of the present disclosure.

FIG. 5 shows a cross sectional view of a MTJ MRAM according to an embodiment of the present disclosure. Material, configuration, dimensions and/or processes the same as or similar to the foregoing embodiments described with FIGS. 1A-4C may be employed in the following embodiments, and detailed explanation thereof may be omitted.

As shown in FIG. 5, the MTJ cells of an MRAM are disposed over a substrate 201. In some embodiments, the substrate 201 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 201 may include an epitaxial layer (epi-layer), which may be strained for performance enhancement, and/or may include a silicon-on-insulator (SOI) structure.

Various electronic devices (not shown), such as transistors (e.g., MOS FET), are disposed on the substrate 201. The MOS FET may include a planar MOS FET, a fin FET and/or a gate-all-around FET. A first interlayer dielectric (ILD) layer 210 is disposed over the substrate 201 to cover the electronic devices. The first ILD layer 210 may be referred to as an inter-metal dielectric (IMD) layer. The first ILD layer 210 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the first ILD layer 210 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Further, a lower metal wiring 213 is formed by, for example, a damascene process. The lower metal wiring 213 includes one or more layers of a conductive material, such as Cu, a Cu alloy, Al or any other suitable conductive materials. Each of the MTJ cells is disposed over the lower metal wiring 215, as shown in FIG. 5. Although FIG. 5 shows three MTJ cells, the number of the MTJ cells is not limited to three.

As shown in FIG. 5, a first insulating layer as an etch stop layer 220 is formed on the first ILD layer 210. In some embodiments, the first insulating layer 220 includes a material different from the first ILD layer 210 and includes silicon carbide, silicon nitride, aluminum oxide or any other suitable material. The thickness of the first insulating layer 220 is in a range from about 10 nm to about 25 nm in some embodiments.

A second ILD layer 225 is formed over the first insulating layer 220. The second ILD layer includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210 and the material for the second ILD layer 225 are the same. In other embodiments, different dielectric materials are used for the first ILD layer 210 and the second ILD layer 225.

A via contact 219 is formed in contact with the lower metal wiring 215 and passing through the second ILD layer 225 and the first etch stop layer 220 in some embodiments. In some embodiments, the via contact 219 includes a liner layer 215 and a body layer 217. The liner layer 215 includes one or more layers of Ti, TiN, Ta or TaN, or other suitable material, and the body layer 217 includes one or more layers of W, Cu, Al, Mo, Co, Pt, Ni, and/or an alloy thereof or other suitable material, in some embodiments.

An MRAM cell structure includes a bottom electrode 254, an MTJ film stack 255 and a top electrode 256, as shown in FIG. 5. The bottom electrode 254, the MTJ film stack 110 and the top electrode 256 correspond to the first electrode 110, the MTJ functional layer 101 and the second electrode 155 of FIG. 1B. The MRAM cell structure has a tapered shape as shown in FIG. 5. The width of the MRAM cell structure at the bottom (the bottom electrode 254) is in a range from about 10 nm to about 50 nm in some embodiments, and is greater than the width at the top (the top electrode 256). The thickness of the bottom electrode 254 is in a range from about 5 nm to about 20 nm in some embodiments. The thickness of the MTJ film stack 255 is in a range from about 15 nm to about 50 nm in some embodiments.

In some embodiments, a first insulating cover layer 227 as a sidewall spacer layer is formed on opposing side walls of the MRAM cell structure. The first insulating cover layer 227 includes one or more layers of insulating material. In some embodiments, a nitride-based insulating material is used. In certain embodiments, the nitride-based insulating material is a silicon nitride-based insulating material, such as silicon nitride, SiON, SiCN and SiOCN. The thickness T1 of the first insulating cover layer 227 is in a range from about 5 nm to about 70 nm in some embodiments, and is in a range from about 10 nm to about 30 nm in other embodiments. In some embodiments, no first insulating cover layer (silicon nitride-based) is used.

Further, a second insulating cover layer 280 is formed over the first insulating cover layer 227. The second insulating cover layer 280 includes one or more layers of insulating material different from the first insulating cover layer 227 and has an oxygen getter property to prevent oxygen from diffusing into the MTJ film stack 255.

In some embodiments, a zirconium-based insulating material is used as an oxygen getter layer 280. In certain embodiments, the zirconium-based insulating material includes one or more of zirconium nitride (ZrN), zirconium carbide (ZrC) and zirconium diboride (ZrB$_2$). The thickness T2 of the second insulating cover layer 280 is in a range from about 10 nm to about 70 nm in some embodiments, and is in a range from about 20 nm to about 50 nm in other embodiments. The thickness T2 of the second insulating cover layer 280 is equal to or greater than the thickness T1 of the first insulating cover layer in some embodiments. In other embodiments, the thickness T2 of the second insulating cover layer 280 is smaller than the thickness T1 of the first insulating cover layer 227.

Further, a third insulating cover layer 285 is optionally formed over the second insulating cover layer 280. The third insulating cover layer 285 includes one or more layers of insulating material different from the first and second insulating cover layers and has an oxygen blocking property to prevent oxygen from diffusing into the second insulating cover layer 280.

In some embodiments, the third insulating cover layer includes SiC. The thickness T3 of the third insulating cover layer 285 is in a range from about 5 nm to about 70 nm in some embodiments, and is in a range from about 10 nm to about 50 nm in other embodiments. The thickness T3 of the third insulating cover layer 285 is equal to or greater than the thickness T2 of the second insulating cover layer in some embodiments. In other embodiments, the thickness T3 of the third insulating cover layer 285 is smaller than the thickness T2 of the second insulating cover layer 280.

Further a third ILD layer 230 is disposed in spaces between the MRAM cell structures. The third ILD layer 230 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210, the material for the second ILD layer 225 and the material for the third ILD layer 230 are the same. In other embodiments, at least two of them are made of different dielectric materials.

Further, a fourth ILD layer is disposed over the third ILD layer 230. In some embodiments, the fourth ILD layer is a multiple layer structure and includes a first dielectric layer 235 as an etch stop layer formed on the third ILD layer 230, a second dielectric layer 237 formed on the first dielectric layer 235 and a third dielectric layer 240 formed on the second dielectric layer. In other embodiments, the fourth ILD layer is a two-layer structure without one of the first or second dielectric layers.

In some embodiments, the first dielectric layer 235 and second dielectric layer 237 are made of a different material than the third dielectric layer 240 and include one or more layers of SiN ($Si_3N_4$), SiON, SiOCN, SiCN, SiC or any other suitable material. In some embodiments, the first dielectric layer 235 and second dielectric layer 237 are made of different materials from each other.

The third dielectric layer 240 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like.

In some embodiments, the material for the first ILD layer 210, the material for the second ILD layer 225, the material for the third ILD layer 230 and the material for the third dielectric layer 240 are the same. In other embodiments, at least two of them are made of different dielectric materials. The thickness of the third dielectric layer 240 is greater than the thicknesses of the first and second dielectric layers 235 and 237 in some embodiments.

A conductive contact 245 is formed in contact with the top electrode 256, as shown in FIG. 5. The conductive contact 245 is the same as or similar to the lower metal wiring 213 and/or the via contact 219 and is made of, for example, Cu, Al, Ta, Ti, Mo, Co, Pt, Ni, W, TiN and/or TaN and/or an alloy thereof or other suitable material.

As shown in FIG. 5, the upper surface of the top electrode 256 is substantially flush with the upper surfaces of the first insulating cover layer 227 and/or the second insulating cover layer 280 in some embodiments.

FIGS. 6A-11B show various stages of a sequential manufacturing process of the semiconductor device including an MRAM according to an embodiment of the present disclosure. It is understood that additional operations can be provided before, during, and after processes shown by FIGS. 6A-11B, and some of the operations described below can be replaced or eliminated, for additional embodiments of the method. Material, configuration, dimensions and/or processes the same as or similar to the foregoing embodiments described with FIGS. 1A-5 may be employed in the following embodiments, and detailed explanation thereof may be omitted.

Figure 6A:
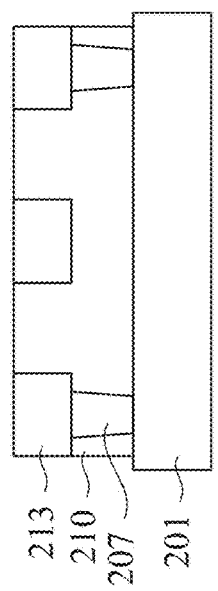
FIGS. 6A, 6B and 6C show various stages of a sequential manufacturing process of the semiconductor device including an MRAM according to an embodiment of the present disclosure.
Figure 6B:
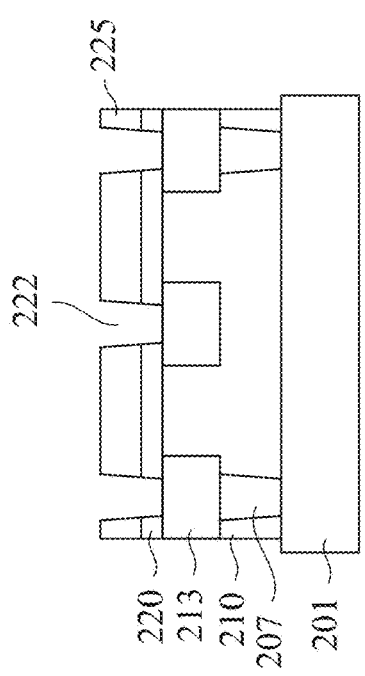
Figure 6C:
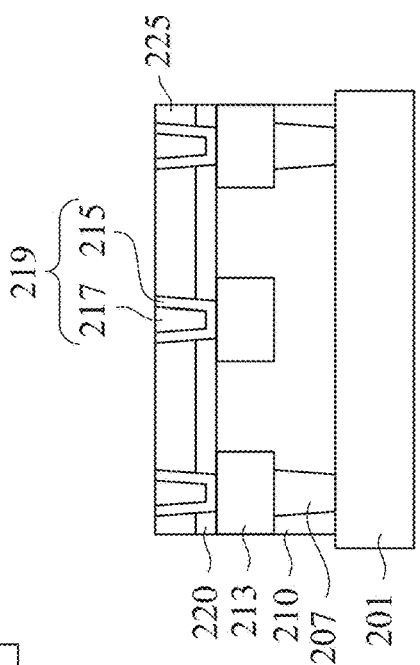

As shown in FIG. 6A, lower metal wirings 213 are formed in the first ILD layer 210 over the substrate 201. In some embodiments, via contacts 207 are provided under the lower metal wirings 213. Then, as shown in FIG. 6B, a first insulating layer as an etch stop layer 220 is formed over the structure of FIG. 6A, and a second ILD layer 225 is formed over the first insulating layer 220. Further, as shown in FIG. 6B, via contact openings 222 are formed to expose the upper surface of the lower metal wirings 213, by using one or more lithography and etching operations. Subsequently, via contacts 219 including layers 215 and 217 are formed, as shown in FIG. 6C. One or more film forming operations, such as CVD, PVD including sputtering, ALD, electro-chemical plating and/or electro-plating, are performed, and a planarization operation, such as CMP, is performed to fabricate the via contacts 219.

Figures 7A, 7B:
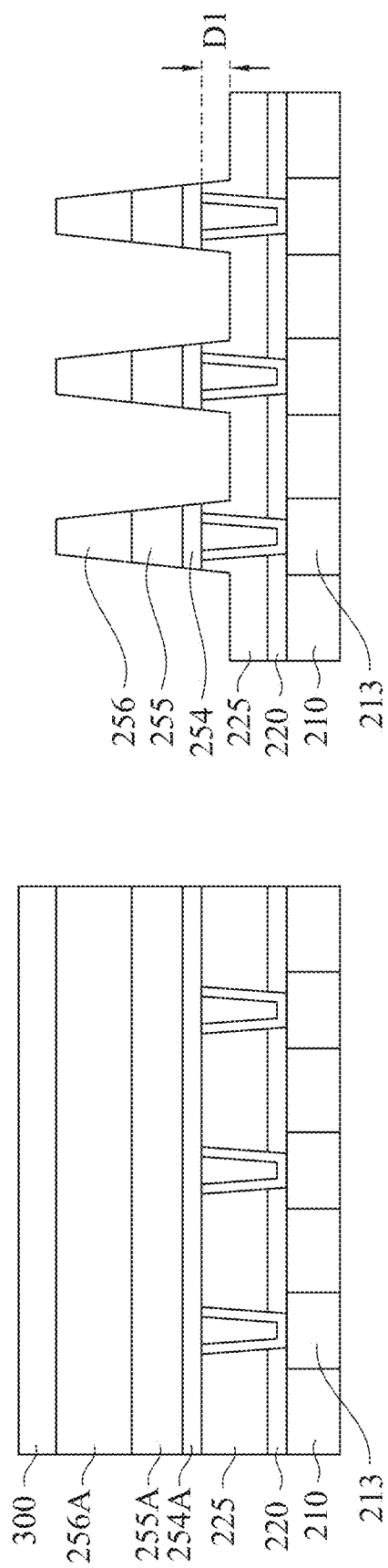
FIGS. 7A and 7B show various stages of a sequential manufacturing process of the semiconductor device including an MRAM according to an embodiment of the present disclosure.

Then, as shown in FIG. 7A, a first conductive layer 254A for the bottom electrode 254, a stacked layer 255A for the MTJ film stack 255 and a second conductive layer 256A for the top electrode 256 are sequentially formed. In some embodiments, a layer 300 for a hard mask is further formed on the second conductive layer 256A.

By using one or more lithography and etching operations, the film stack shown in FIG. 7A is patterned into an MRAM cell structure including the bottom electrode 254, the MTJ film stack 255 and the top electrode 256, as shown in FIG. 7B. In some embodiments, an oxidation operation is performed to adjust the resistivity of the MTJ film stack. The width of the patterned MTJ film stack 255 is in a range from about 10 nm to about 50 nm at the middle of the MTJ film stack 255 in some embodiments, and is in a range from about 15 nm to about 30 nm in other embodiments. In some embodiments, after the patterning the second conductive layer 256A, the stacked layer 255A and the first conductive layer 256A, the second ILD layer 225 is partially recessed. The amount D1 of the recess is in a range from about 1 nm to about 30 nm in some embodiments.

Figure 8A:
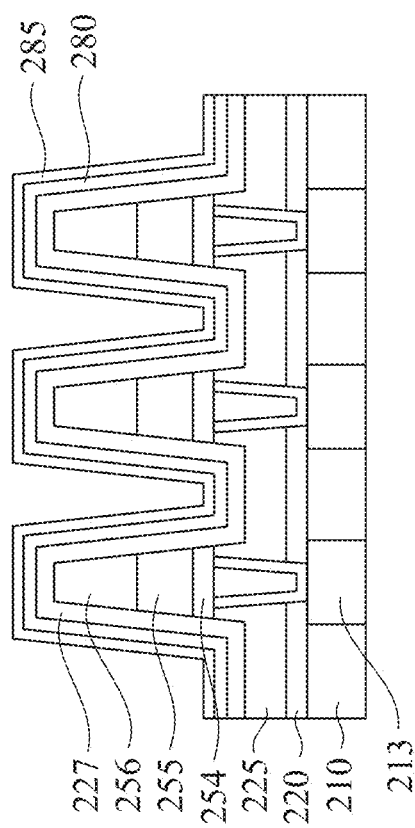
FIGS. 8A and 8B show various stages of a sequential manufacturing process of the semiconductor device including an MRAM according to an embodiment of the present disclosure.

Subsequently, as shown in FIG. 8A, a first insulating cover layer 227 is formed to cover the MRAM cell structure. The first insulating cover layer 227 can be formed by CVD, PVD or ALD or any other suitable film deposition method. In some embodiments, the first insulating cover layer 227 is formed by CVD, PVD or ALD at a temperature less than about 150° C., such as a range from about 100° C. to about 150° C. When the first insulating cover layer 227 is formed at a higher temperature, such as a range from about 200° C. to about 300° C. (or more), the film formation process may cause damage to the MTJ film stack 255. As shown in FIG. 8A, the first insulating cover layer 227 is conformally formed.

Figure 8B:
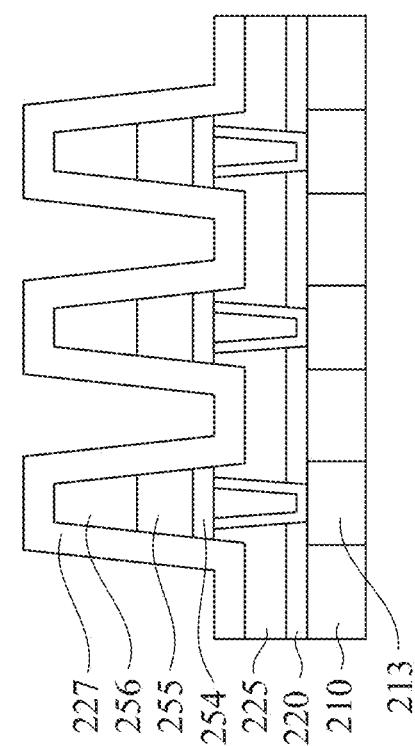

Then, as shown in FIG. 8B, a second insulating cover layer 280 is formed to cover the MRAM cell structure. The second insulating cover layer 280 can be formed by CVD, PVD or ALD or any other suitable film deposition method. As shown in FIG. 8B, the second insulating cover layer 280 is conformally formed. As set forth above, the second insulating cover layer 280 is made of a zirconium-based insulating material including one or more of zirconium nitride (ZrN), zirconium carbide (ZrC) and zirconium diboride ($ZrB_2$).

Further, as shown in FIG. 8B, a third insulating cover layer 285 is formed on the second insulating cover layer 280. In some embodiments, the third insulating cover layer 285 is amorphous SiC formed by CVD, PVD or ALD or any other suitable film deposition method. As shown in FIG. 8B, the third insulating cover layer 285 is conformally formed.

Figures 9A, 9B:
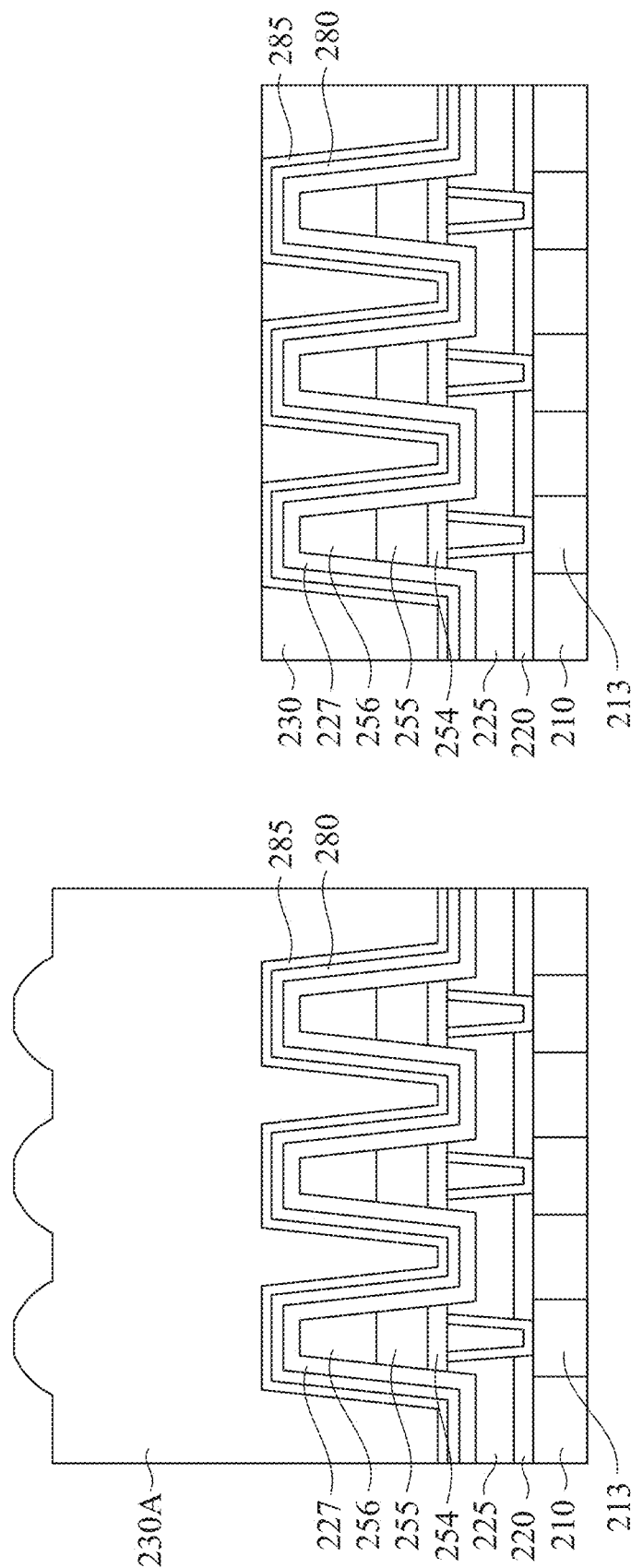
FIGS. 9A and 9B show various stages of a sequential manufacturing process of the semiconductor device including an MRAM according to an embodiment of the present disclosure.

Next, as shown in FIG. 9A, a dielectric material layer 230A for the third ILD layer 230 is formed to fully cover the third insulating cover layer 285. In some embodiments, an etch-back operation is performed on the dielectric material layer 230A, and then a CMP operation is performed, as shown in FIG. 9B. Because the selectivity for the CMP operation between the third insulating cover layer 285 and the third ILD layer 230 is high, the CMP operation can utilize the third insulating cover layer 285 as a stop layer, and thus the upper surface of the third insulating cover layer 285 above the MRAM cell structure is substantially flush with the upper surfaces of the third ILD layer 230 in some embodiments.

Figures 10A, 10B:
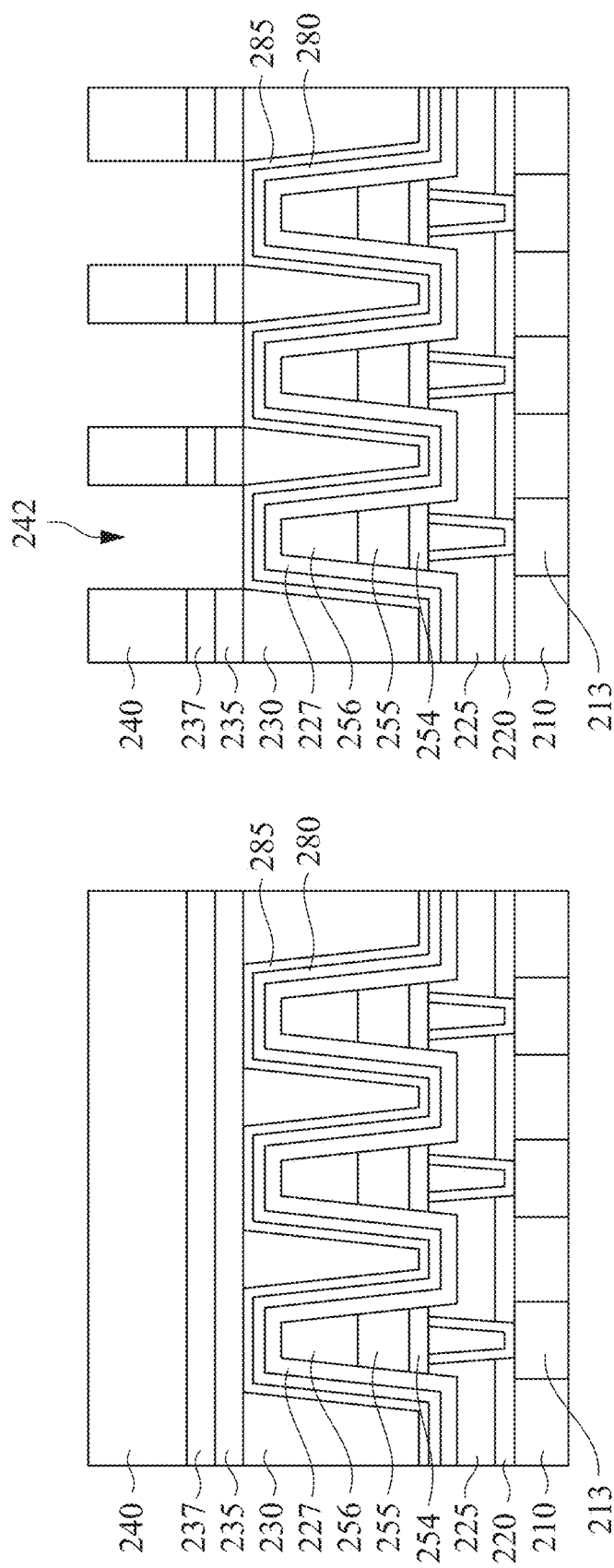
FIGS. 10A and 10B show various stages of a sequential manufacturing process of the semiconductor device including an MRAM according to an embodiment of the present disclosure.

Subsequently, as shown in FIG. 10A, a fourth ILD layer including a first dielectric layer 235, a second dielectric layer 237 and a third dielectric layer 240 is formed over the structure of FIG. 9B. The dielectric layers of the fourth ILD layer can be formed by CVD, PVD or ALD or other suitable film formation method. In some embodiments, the third dielectric layer 240 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Then, as shown in FIG. 10B, contact openings 242 are formed by using one or more lithography and etching operations. Because the selectivity in the etching operation between the third insulating cover layer 285 and the fourth ILD layer is high, the etching operation can utilize the third insulating cover layer 285 as an etch stop layer.

Next, as shown in FIG. 11, a part of the third insulating cover layer 285, a part of the second insulating cover layer 280 and a part of the first insulating cover layer 227 are removed by dry and/or wet etching, thereby exposing the top electrode 256. In some embodiments, part of the third insulating cover layer 285 and part of the second insulating cover layer 280 are removed, and then part of the first insulating cover layer 227 is removed. In some embodiments, one or more wet etching operation are used. In certain embodiments, a wet etching operation is performed to remove the second and third insulating cover layers and a dry etching operation is performed to remove first insulating cover layer 227. In some embodiments, the Zr-based second insulating cover layer 280 can be wet-etched by using a mixed solution of ethanol, water, glycerin, lactic acid, $H_3PO_4$, and citric acid. In other embodiments, a wet etching operation is also performed to remove the first insulating cover layer 227. By using wet etching, it is possible to suppress damage to the MTJ film stack 255.

Figures 11A, 11B:
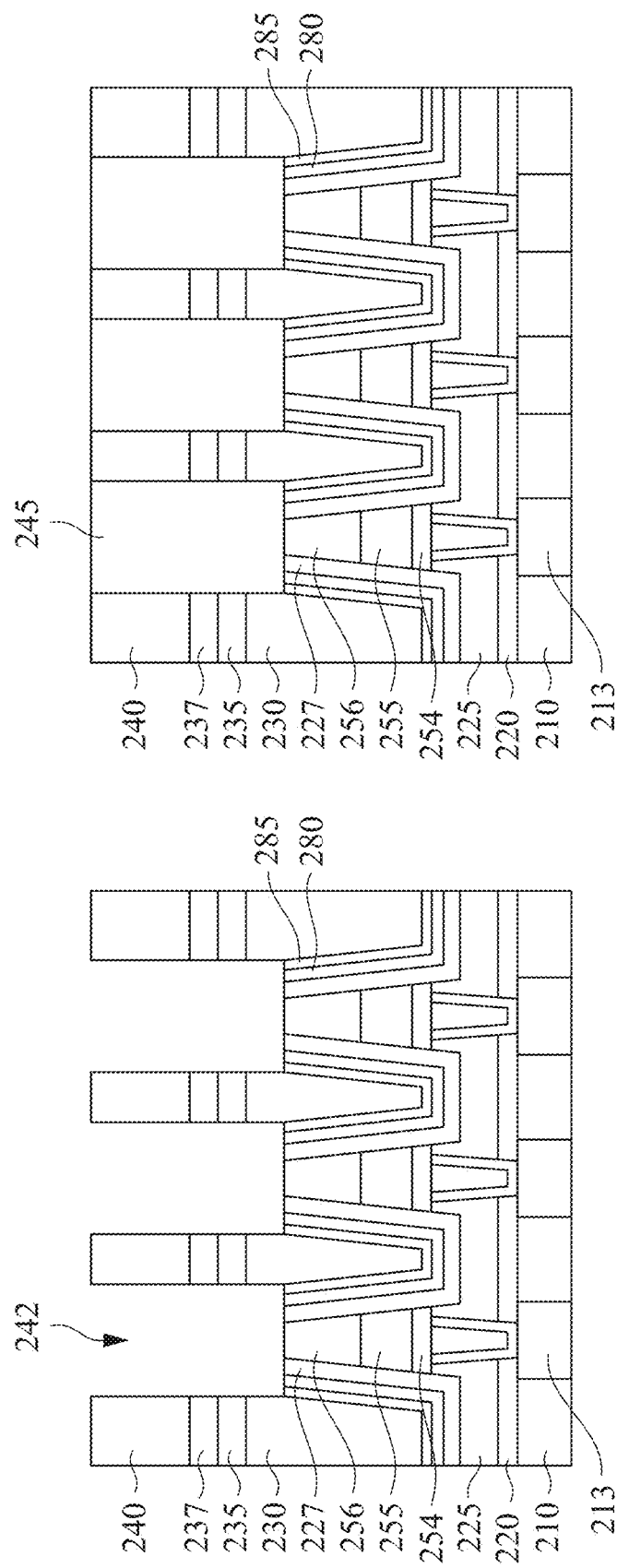
FIGS. 11A and 11B show various stages of a sequential manufacturing process of the semiconductor device including an MRAM according to an embodiment of the present disclosure.

Subsequently, as shown in FIG. 11B, the contact openings 242 are filled with a conductive material so as to form conductive contacts 245 contacting the exposed top electrode 256.

It is understood that the device shown in FIG. 11B undergoes further semiconductor processes to form various features such as interconnect metal layers, dielectric layers, passivation layers, etc.

FIGS. 12-17 show various stages of a sequential manufacturing process of the semiconductor device including an MRAM according to an embodiment of the present disclosure. It is understood that additional operations can be provided before, during, and after processes shown by FIGS. 12-17, and some of the operations described below can be replaced or eliminated, for additional embodiments of the method. Material, configuration, dimensions and/or processes the same as or similar to the foregoing embodiments described with FIGS. 1A-11B may be employed in the following embodiments, and detailed explanation thereof may be omitted.

Figure 12:
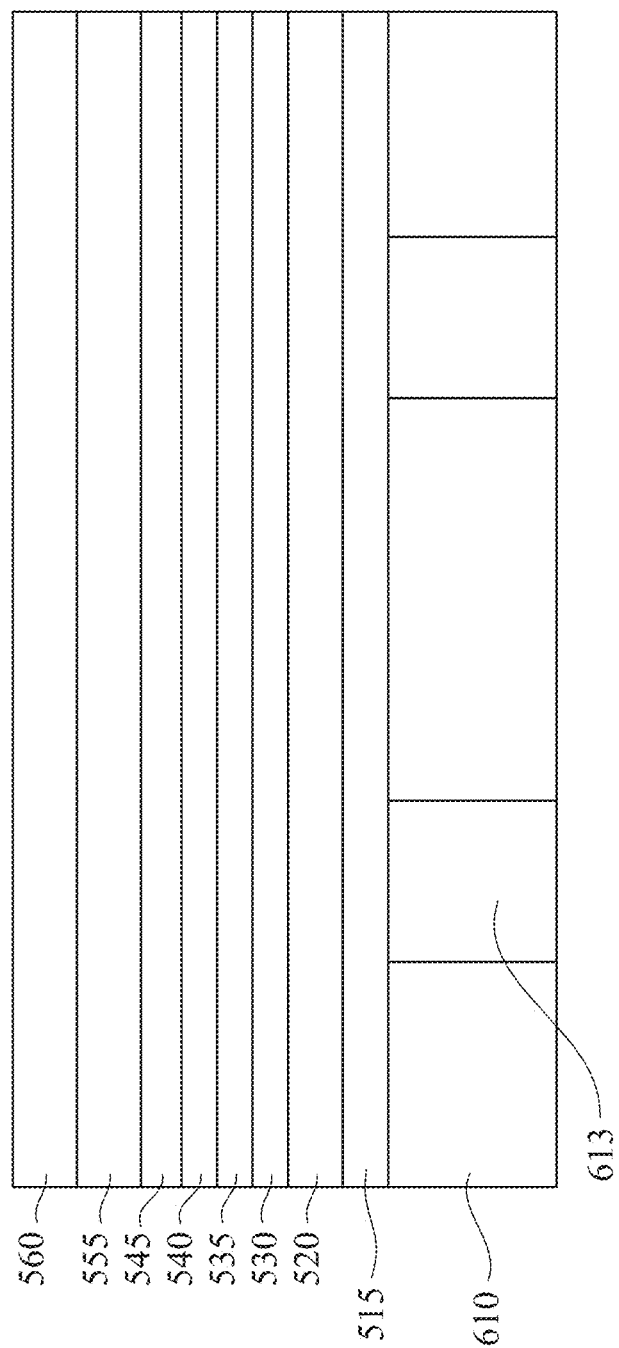
FIG. 12 shows one of the various stages of a sequential manufacturing process of the semiconductor device including an MRAM according to another embodiment of the present disclosure.

As shown in FIG. 12, a bottom electrode 613 is formed in a bottom ILD layer 610. In some embodiments, the bottom electrode 613 has the same structure as the via contact 219 as set forth above. In some embodiments, the bottom ILD layer 610 has the same structure as the second ILD layer 225 as set forth above.

Further, a stacked layer is formed over the bottom electrode 613 and the bottom ILD layer 610. In some embodiments, the stacked layer includes a seed layer 515, a synthetic anti-ferromagnetic layer 520, a pinned layer 530, a tunneling barrier layer 535, a free layer 540, a capping layer 545, and an upper electrode layer 555. In certain embodiments, a hard mask layer 550 is formed on the upper electrode layer 555.

In some embodiments, the seed layer 515 has the same configuration as the seed layer 115, the synthetic anti-ferromagnetic layer 520 has the same configuration as the first pinned magnetic layer 120, the pinned layer 530 has the same configuration as the pinned magnetic layer 130, the tunneling barrier layer 535 has the same configuration as the tunneling barrier layer 135, the free layer 540 has the same configuration as the free magnetic layer 140, the capping layer 545 has the same configuration as the capping layer 145 and the upper electrode layer 555 has the same configuration as the second electrode layer 155. The stacked layer further includes one or more additional layers in certain embodiments. The hard mask layer 560 is made of one or more layers of an insulating material, such as silicon oxide, silicon nitride, aluminum oxide or aluminum nitride.

Figure 13:
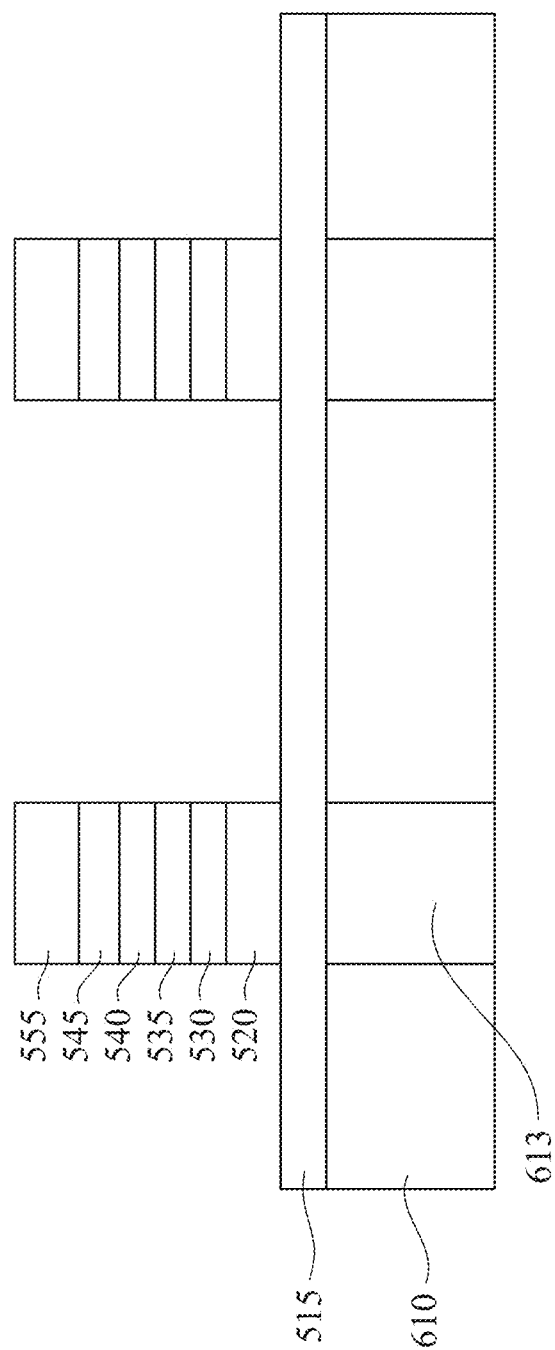
FIG. 13 shows one of the various stages of a sequential manufacturing process of the semiconductor device including an MRAM according to another embodiment of the present disclosure.

Then, by using one or more lithography and etching operations, the stacked layer is patterned as shown in FIG. 13. In some embodiments, the etching stops at the seed layer 515. By stopping etching at the seed layer 515, it is possible to prevent the bottom electrode 513 from being exposed by the etching. In other embodiments, the seed layer 515 is also etched to expose the surface of the bottom ILD layer 610. After the etching, the hard mask layer 560 is removed. In some embodiments, an oxidation operation is performed to adjust resistivity of the MTJ film stack. The width of the patterned film stack is in a range from about 10 nm to about 50 nm in some embodiments, and is in a range from about 15 nm to about 30 nm in other embodiments.

Figure 14:
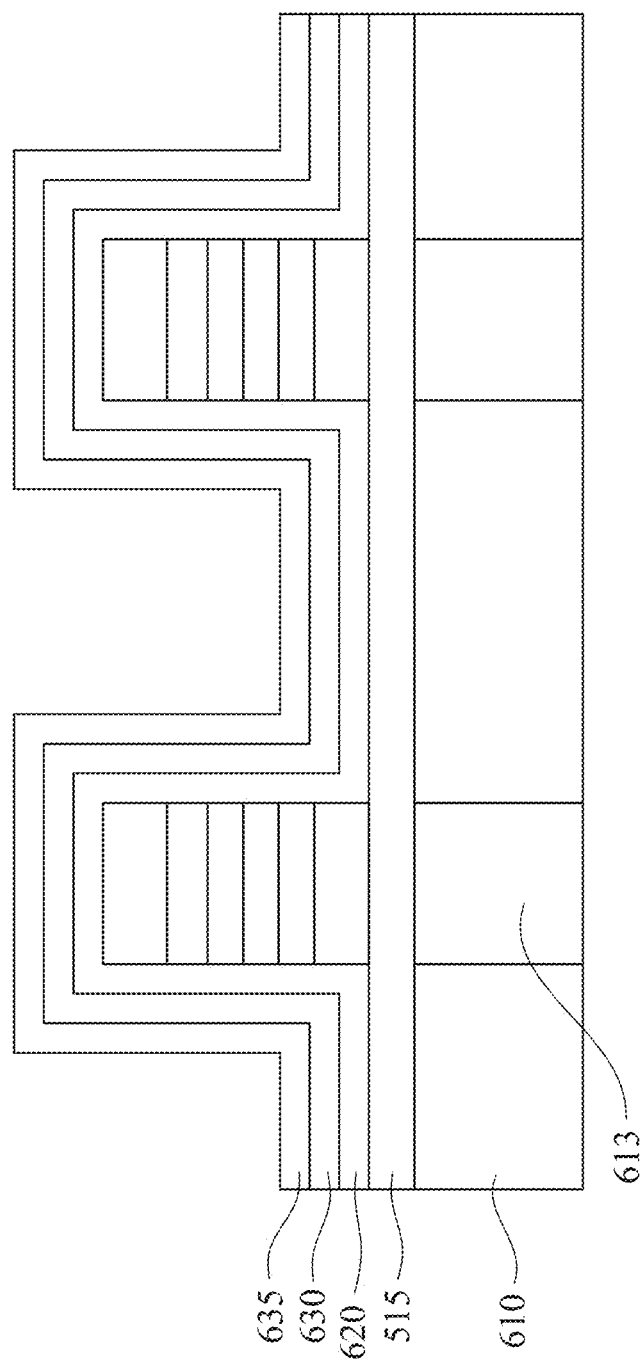
FIG. 14 shows one of the various stages of a sequential manufacturing process of the semiconductor device including an MRAM according to another embodiment of the present disclosure.

Subsequently, as shown in FIG. 14, a first insulating cover layer 620, a second insulating cover layer 630 and a third insulating cover layer 635 are formed in this order to cover the patterned stacked layer. The first insulating cover layer 620, the second insulating cover layer 630 and the third insulating cover layer 635 have the same configuration as the first, second and third insulating cover layers 227, 280 and 285.

Figure 15:
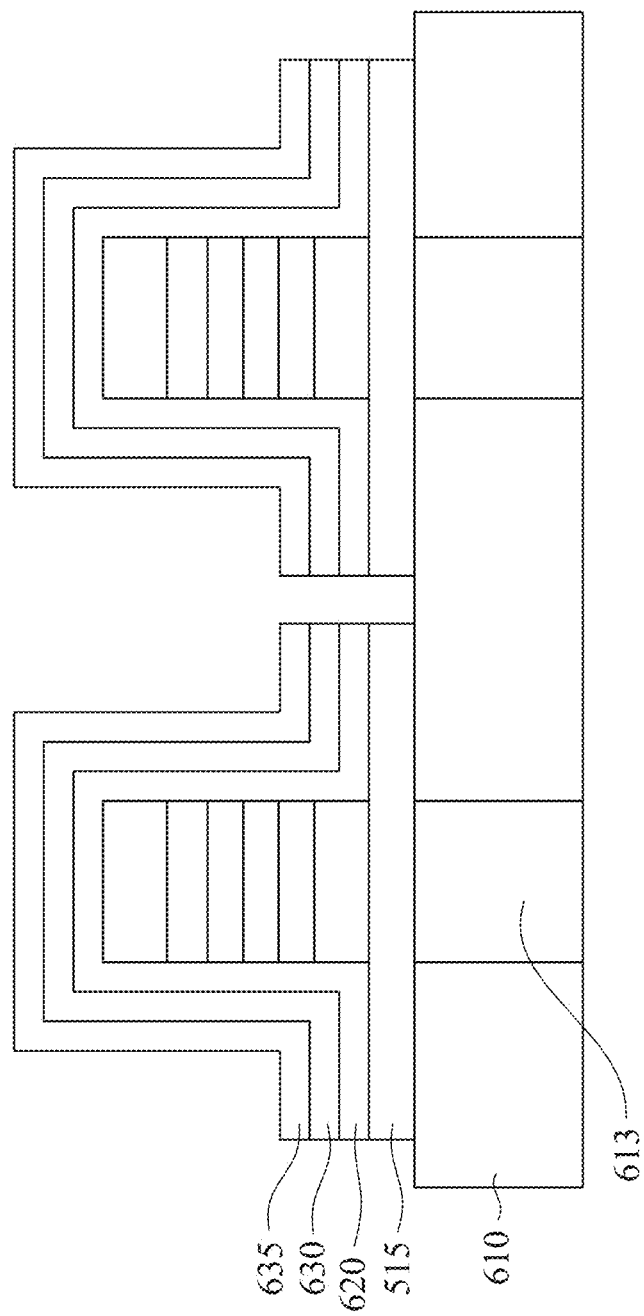
FIG. 15 shows one of the various stages of a sequential manufacturing process of the semiconductor device including an MRAM according to another embodiment of the present disclosure.

Then, the third, second and first insulating cover layers 635, 630 and 620 and the seed layer 515 are patterned by using one or more lithography and etching operations, as shown in FIG. 15. As shown in FIG. 15, the width of the seed layer 515 is greater than the width of the patterned stacked layer and the width of the bottom electrode 613. The width of the seed layer is in a range from about 20 nm to about 100 nm in some embodiments.

Figure 16:
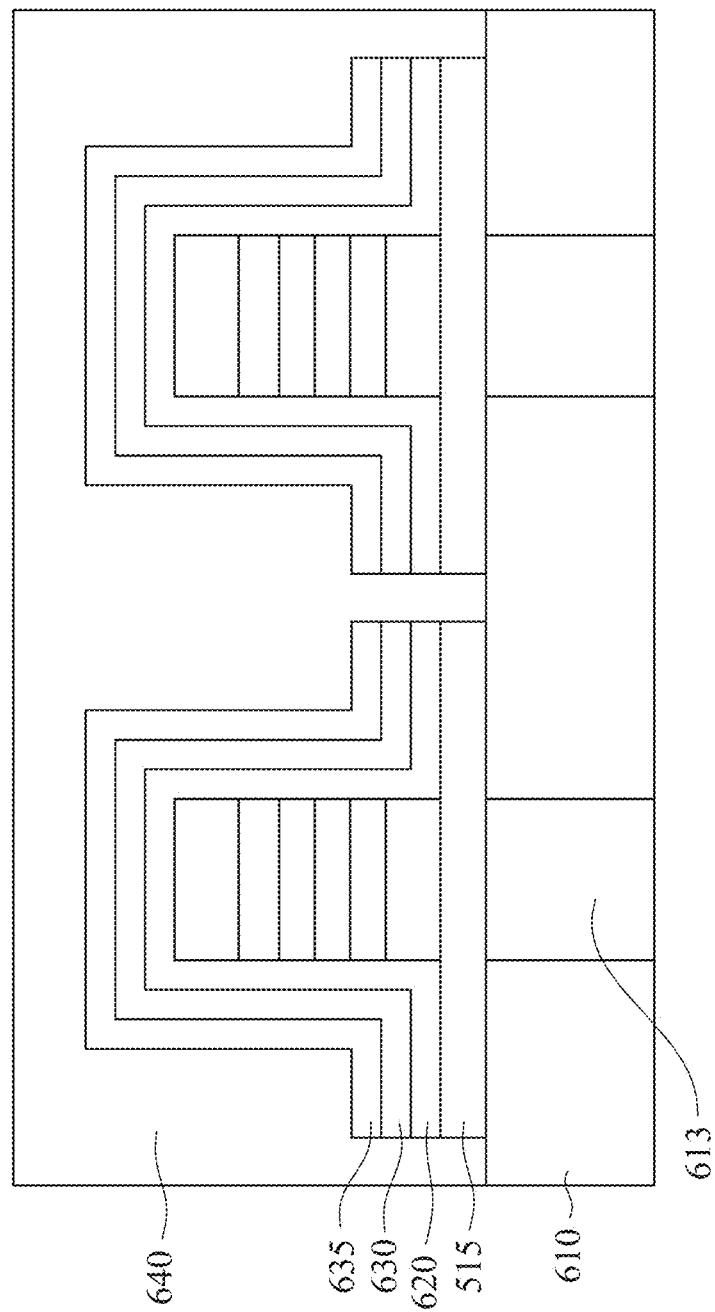
FIG. 16 shows one of the various stages of a sequential manufacturing process of the semiconductor device including an MRAM according to another embodiment of the present disclosure.

Further, as shown in FIG. 16, an upper ILD layer 640 is formed over the structure of FIG. 15. The upper ILD layer 640 is made of one or more layers of dielectric material, and has the same configuration as one or more of the third ILD layer 230 and fourth ILD layers 235/237/240.

Figure 17:
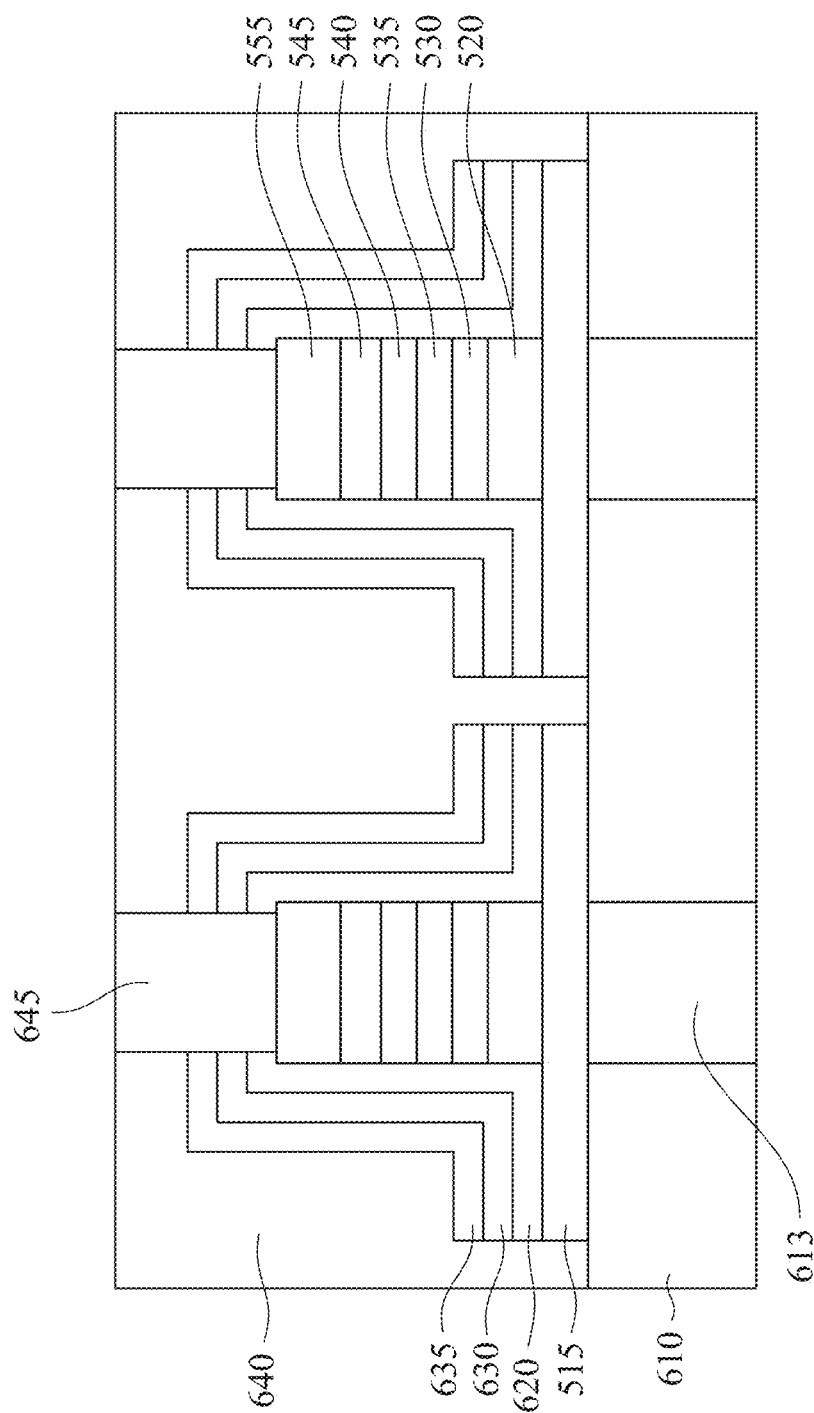
FIG. 17 shows one of the various stages of a sequential manufacturing process of the semiconductor device including an MRAM according to another embodiment of the present disclosure.

Then, as shown in FIG. 17, the upper ILD layer 630, the third insulating cover layer 635, the second insulating cover layer 630 and the first insulating cover layer 620 are patterned by one or more lithography and etching operations, to form a contact opening, and the contact opening is filled with a conductive material 645 similar to conductive contact 245.

It is understood that the device shown in FIG. 17 undergoes further semiconductor processes to form various features such as interconnect metal layers, dielectric layers, passivation layers, etc.

It will be understood that not all advantages have been necessarily discussed herein, no particular advantage is required for all embodiments or examples, and other embodiments or examples may offer different advantages.

For example, in the present disclosure, by using a Zr-based material which has an oxygen getter property, it is possible to prevent oxygen to diffuse into the MTJ film stack, thereby prevent damage to the MTJ film stack which would otherwise be caused by high temperature processes. In addition, the used of a SiC layer can also prevent oxygen to diffuse into the MTJ film stack, and thus prevent damage to the MTJ film stack. With the use of a Zr-based material optionally with a SiC layer, a ratio of high-resistance $R_H$ and low-resistance $R_L$ of the MTJ MRAM cell stack, i.e., $(R_H-R_L)/(R_H+R_L)$ is more than about 80% in some embodiments, and is more than about 90% in other embodiments.

In accordance with an aspect of the present disclosure, in a method of manufacturing a semiconductor device, a magnetic random access memory (MRAM) cell structure including a bottom electrode, a magnetic tunnel junction (MTJ) stack and a top electrode is formed. A first insulating cover layer is formed over the MRAM cell structure. A second insulating cover layer is formed over the first insulating cover layer. An interlayer dielectric (ILD) layer is formed. A contact opening is formed in the ILD layer, thereby exposing the second insulating cover layer. A part of the second insulating cover layer and a part of the first insulating cover layer are removed, thereby exposing the top electrode. A conductive layer is formed in the opening contacting the top electrode. The second insulating cover layer has an oxygen getter property. In one or more of the foregoing and following embodiments, the second insulating cover layer is made of a zirconium-based insulating material different from the first insulating cover layer. In one or more of the foregoing and following embodiments, the first insulating cover layer is one or more selected from the group consisting of $Si_3N_4$, SiON and SiOCN. In one or more of the foregoing and following embodiments, the zirconium-based insulating material is one or more selected from the group consisting of ZrN, ZrC and $ZrB_2$. In one or more of the foregoing and following embodiments, the ILD layer includes a bottom ILD layer and an upper ILD layer, and the opening is formed by etching the upper ILD layer. In one or more of the foregoing and following embodiments, the upper ILD layer includes two or more dielectric layers. In one or more of the foregoing and following embodiments, the forming the ILD layer includes forming a dielectric material for the bottom ILD layer over the second insulating cover layer, planarizing the dielectric material to expose the second insulating cover layer, thereby forming the bottom ILD layer, and forming the two or more dielectric layers on the bottom ILD layer and the second insulating cover layer. In one or more of the foregoing and following embodiments, a third insulating cover layer is formed over the second insulating cover layer. In one or more of the foregoing and following embodiments, the third insulating cover layer is made of SiC.

In accordance with another aspect of the present disclosure, in a method of manufacturing a semiconductor device including a magnetic random access memory (MRAM) cell, forming a first conductive layer over a first interlayer dielectric (ILD) layer is formed. A stacked layer for a magnetic tunnel junction (MTJ) stack is formed over the first conductive layer. A second conductive layer is formed over the stacked layer. The second conductive layer, the stacked layer and the first conductive layer are patterned, thereby forming an MRAM cell structure. The MRAM cell structure includes a bottom electrode formed by the first conductive layer, the magnetic tunnel junction (MTJ) stack and a top electrode formed by the second conductive layer. A first insulating cover layer is formed over the MRAM cell structure. A second insulating cover layer is formed over the first insulating cover layer. A third insulating cover layer is formed over the second insulating cover layer. A second ILD layer is formed. A contact opening is formed in the second ILD layer, thereby exposing the third insulating cover layer. A part of the third insulating cover layer, a part of the second insulating cover layer and a part of the first insulating cover layer are removed, thereby exposing the top electrode. A third conductive layer is formed in the opening contacting the top electrode. In one or more of the foregoing and following embodiments, after the patterning the second conductive layer, the stacked layer and the first conductive layer, the first ILD layer is partially recessed. In one or more of the foregoing and following embodiments, a bottom of the first insulating cover layer is located below a bottom of the bottom electrode. In one or more of the foregoing and following embodiments, the second insulating cover layer is made of ZrN. In one or more of the foregoing and following embodiments, the third insulating cover layer is made of SiC. In one or more of the foregoing and following embodiments, the first insulating cover layer is made of one or more selected from the group consisting of silicon nitride, SiON, SiCN, and SiOCN.

In accordance with another aspect of the present disclosure, in a method of manufacturing a semiconductor device, a bottom electrode is formed in a bottom interlayer dielectric (ILD) layer. A film stack including a seed layer, a magnetic tunnel junction (MTJ) stack and a upper electrode layer is formed. The upper electrode layer and the MTJ stack are patterned, thereby forming a patterned stack. A first insulating cover layer is formed over the seed layer and the patterned stack. A second insulating cover layer is formed over the first insulating cover layer. The second insulating cover layer, the first insulating cover layer and the seed layer are patterned, thereby forming a magnetic random access memory (MRAM) cell structure. An upper ILD layer is formed over the MRAM cell structure. A contact opening is formed in the ILD layer, thereby exposing the second insulating cover layer. A conductive layer is formed in the opening contacting the top electrode. In one or more of the foregoing and following embodiments, the second insulating cover layer is one or more selected from the group consisting of ZrN, ZrC and $ZrB_2$. In one or more of the foregoing and following embodiments, a third insulating cover layer is formed over the second insulating cover layer. The third insulating layer is patterned such that the MRAM cell structure further includes a patterned third insulating cover layer. In one or more of the foregoing and following embodiments, the third insulating cover layer is SiC. In one or more of the foregoing and following embodiments, a width of the seed layer of the MRAM cell structure is greater than a width of the bottom electrode.

In accordance with one aspect of the present disclosure, a semiconductor device includes a magnetic random access memory (MRAM) cell. The semiconductor device includes a magnetic random access memory (MRAM) cell structure disposed over a substrate, a first insulating cover layer covering sidewalls of the MRAM cell structure, a second insulating cover layer disposed over the first insulating cover layer, a dielectric layer, and a conductive contact in contact with the top electrode. The MRAM cell structure includes a bottom electrode, a magnetic tunnel junction (MTJ) stack and a top electrode. The first insulating cover layer is made of a nitride-based insulating material. The second insulating cover layer is made of a zirconium-based insulating material different from the nitride-based insulating material. In one or more of the foregoing and following embodiments, a thickness of the second insulating cover layer is in a range from 20 nm to 50 nm. In one or more of the foregoing and following embodiments, the semiconductor device further includes a third insulating cover layer disposed over the second insulating cover layer. The third insulating cover layer is made of a different material than the second insulating cover layer and has an oxygen blocking property. In one or more of the foregoing and following embodiments, the third insulating cover layer is made of SiC. In one or more of the foregoing and following embodiments, a thickness of the third insulating cover layer is in a range from 10 nm to 50 nm. In one or more of the foregoing and following embodiments, the zirconium-based insulating material is one or more selected from the group consisting of ZrN, ZrC and ZrB$_2$. In one or more of the foregoing and following embodiments, the dielectric layer includes multiple layers, and the conductive contact passes through the multiple layers. In one or more of the foregoing and following embodiments, the MRAM cell structure includes a seed layer, and a width of the seed layer of the MRAM cell structure is greater than a width of the bottom electrode.

In accordance with another aspect of the present disclosure, a semiconductor device includes a magnetic random access memory (MRAM) cell. The semiconductor device includes magnetic random access memory (MRAM) cell structures disposed over a substrate, a first insulating cover layer covering sidewalls of each of the MRAM cell structures, a second insulating cover layer disposed over the first insulating cover layer, a third insulating cover layer disposed over the second insulating cover layer, a bottom dielectric layer filling a space between adjacent MRAM cell structures, an upper dielectric layer disposed over the bottom dielectric layer, and a conductive contact in contact with the top electrode of each of the MRAM cell structures. Each of the MRAM cell structure includes a bottom electrode, a magnetic tunnel junction (MTJ) stack and a top electrode. The second insulating cover layer has an oxygen getter property, and the third insulating cover layer has an oxygen blocking property. In one or more of the foregoing and following embodiments, the first insulating cover layer is one or more selected from the group consisting of Si$_3$N$_4$, SiON and SiOCN. In one or more of the foregoing and following embodiments, the second insulating cover layer is one or more selected from the group consisting of ZrN, ZrC and ZrB$_2$. In one or more of the foregoing and following embodiments, the third insulating cover layer is made of amorphous SiC. In one or more of the foregoing and following embodiments, the upper dielectric layer includes multiple layers, and the conductive contact passes through the multiple layers. In one or more of the foregoing and following embodiments, the MRAM cell structure includes a seed layer, and a width of the seed layer of the MRAM cell structure is greater than a width of the bottom electrode.

In accordance with another aspect of the present disclosure, a semiconductor device includes a magnetic random access memory (MRAM) cell. The semiconductor device includes a first interlayer dielectric (ILD) layer disposed over a substrate, a via contact disposed in the first ILD layer, a magnetic random access memory (MRAM) cell structure in contact with the via contact, a first insulating cover layer covering sidewalls of the MRAM cell structure, a second insulating cover layer disposed over the first insulating cover layer, a third insulating cover layer disposed over the second insulating cover layer, a dielectric layer, and a conductive contact in contact with the top electrode. The MRAM cell structure includes a bottom electrode, a magnetic tunnel junction (MTJ) stack and a top electrode. The second insulating cover layer is made of one or more selected from the group consisting of ZrN, ZrC and ZrB$_2$. In one or more of the foregoing and following embodiments, a thickness of the second insulating cover layer is in a range from 20 nm to 50 nm. In one or more of the foregoing and following embodiments, the third insulating cover layer is made of SiC. In one or more of the foregoing and following embodiments, a thickness of the third insulating cover layer is in a range from 10 nm to 50 nm. In one or more of the foregoing and following embodiments, the dielectric layer includes multiple dielectric layers. In one or more of the foregoing and following embodiments, one of the multiple dielectric layers include an SiC layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a magnetic random access memory (MRAM) cell, comprising:
   a magnetic random access memory (MRAM) cell structure disposed over a substrate, the MRAM cell structure including a bottom electrode, a magnetic tunnel junction (MTJ) stack and a top electrode;
   a first insulating cover layer covering sidewalls of the MRAM cell structure;
   a second insulating cover layer disposed over the first insulating cover layer;
   a dielectric layer; and
   a conductive contact in contact with the top electrode, wherein:
   the first insulating cover layer is made of a nitride-based insulating material, and
   the second insulating cover layer has an oxygen getter property,
   wherein the second insulating cover layer is one or more selected from the group consisting of ZrC and ZrB$_2$.

2. The semiconductor device of claim 1, wherein the first insulating cover layer is one or more selected from the group consisting of SiON and SiOCN.

3. The semiconductor device of claim 1, further comprising a third insulating cover layer disposed over the second insulating cover layer,
   wherein the third insulating cover layer is made of a different material than the second insulating cover layer and has an oxygen blocking property.

4. The semiconductor device of claim 3, wherein the third insulating cover layer is made of SiC.

5. The semiconductor device of claim 4, wherein a thickness of the third insulating cover layer is in a range from 10 nm to 50 nm.

6. The semiconductor device of claim 1, wherein the zirconium-based insulating material is $ZrB_2$.

7. The semiconductor device of claim 1, wherein:
the dielectric layer includes multiple layers, and
the conductive contact passes through the multiple layers.

8. The semiconductor device of claim 1, wherein:
the MRAM cell structure includes a seed layer, and
a width of the seed layer of the MRAM cell structure is greater than a width of the bottom electrode.

9. The semiconductor device of claim 1, wherein the first insulating cover layer is one or more selected from the group consisting of SiN, SiON and SiOCN.

10. The semiconductor device of claim 1, wherein a thickness of the second insulating cover layer is in a range from 20 nm to 50 nm.

11. A semiconductor device including a magnetic random access memory (MRAM) cell, comprising:
magnetic random access memory (MRAM) cell structures disposed over a substrate, each of the MRAM cell structure including a bottom electrode, a magnetic tunnel junction (MTJ) stack and a top electrode;
a first insulating cover layer covering sidewalls of each of the MRAM cell structures;
a second insulating cover layer disposed over the first insulating cover layer;
a third insulating cover layer disposed over the second insulating cover layer;
a bottom dielectric layer filling a space between adjacent MRAM cell structures;
an upper dielectric layer disposed over the bottom dielectric layer; and
a conductive contact in contact with the top electrode of each of the MRAM cell structures, wherein:
the second insulating cover layer has an oxygen getter property,
the third insulating cover layer has an oxygen blocking property,
the upper dielectric layer disposed over the bottom dielectric layer includes multiple layers, and is separated from the third insulating cover layer by the bottom dielectric layer, and
the conductive contact passes through the multiple layers.

12. The semiconductor device of claim 11, wherein the first insulating cover layer is one or more selected from the group consisting of SiN, SiON and SiOCN.

13. The semiconductor device of claim 11, wherein the second insulating cover layer is one or more selected from the group consisting of ZrN, ZrC and ZrB2.

14. The semiconductor device of claim 13, wherein the third insulating cover layer is made of amorphous SiC.

15. The semiconductor device of claim 11, wherein:
the upper dielectric layer includes at least three layers.

16. The semiconductor device of claim 11, wherein:
the MRAM cell structure includes a seed layer, and
a width of the seed layer of the MRAM cell structure is greater than a width of the bottom electrode.

17. A semiconductor device including a magnetic random access memory (MRAM) cell, comprising:
a first interlayer dielectric (ILD) layer disposed over a substrate;
a via contact disposed in the first ILD layer;
a magnetic random access memory (MRAM) cell structure in contact with the via contact, the MRAM cell structure including a bottom electrode, a magnetic tunnel junction (MTJ) stack and a top electrode;
a first insulating cover layer covering sidewalls of the MRAM cell structure;
a second insulating cover layer disposed over the first insulating cover layer;
a third insulating cover layer disposed over the second insulating cover layer;
a dielectric layer; and
a conductive contact in contact with the top electrode,
wherein the second insulating cover layer has an oxygen getter property, and
the third insulating cover layer is made of SiC.

18. The semiconductor device of claim 17, wherein a thickness of the second insulating cover layer is in a range from 20 nm to 50 nm.

19. The semiconductor device of claim 18, wherein the second insulating cover layer includes ZrC.

20. The semiconductor device of claim 17, wherein a thickness of the third insulating cover layer is in a range from 10 nm to 50 nm.

* * * * *